US009698171B2

(12) United States Patent
Sung et al.

(10) Patent No.: US 9,698,171 B2
(45) Date of Patent: Jul. 4, 2017

(54) ARRAY SUBSTRATE AND METHOD OF MANUFACTURING THE SAME, AND DISPLAY DEVICE

(71) Applicant: BOE Technology Group Co., Ltd., Beijing (CN)

(72) Inventors: Um Yoon Sung, Beijing (CN); Choi-Seung Jin, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/170,003

(22) Filed: Jun. 1, 2016

(65) Prior Publication Data

US 2016/0276375 A1    Sep. 22, 2016

Related U.S. Application Data

(62) Division of application No. 14/447,961, filed on Jul. 31, 2014, now Pat. No. 9,379,148.

(30) Foreign Application Priority Data

Feb. 24, 2014    (CN) .......................... 2014 1 0062127

(51) Int. Cl.
*H01L 21/00* (2006.01)
*H01L 27/12* (2006.01)
(Continued)

(52) U.S. Cl.
CPC .... *H01L 27/1248* (2013.01); *G02F 1/134363* (2013.01); *G02F 1/136227* (2013.01);
(Continued)

(58) Field of Classification Search
CPC . H01L 27/124; H01L 27/1288; H01L 27/127; H01L 27/1248; G02F 1/134363; G02F 1/136227
See application file for complete search history.

(56) References Cited

U.S. PATENT DOCUMENTS

| 6,576,504 | B2 | 6/2003 | Ohtani et al. |
| 9,379,148 | B2* | 6/2016 | Sung .................. H01L 27/1288 |
| 2013/0225960 | A1 | 8/2013 | Porch et al. |

FOREIGN PATENT DOCUMENTS

| CN | 101330063 A | 12/2008 |
| CN | 103928399 A | 7/2014 |
| EP | 0 978 877 A2 | 2/2000 |

OTHER PUBLICATIONS

First Office Action, including Search Report, for Chinese Patent Application No. 201410062127.6, dated Dec. 1, 2015, 13 pages.
(Continued)

*Primary Examiner* — Richard Booth
(74) *Attorney, Agent, or Firm* — Westman, Champlin & Koehler, P.A.

(57) ABSTRACT

Disclosed is method of manufacturing an array substrate, including steps of: forming a thin film transistor on a substrate through a patterning process; and on the substrate on which the thin film transistor has been formed, forming an organic transparent insulation layer including a first via hole and a first transparent electrode layer disposed above the organic transparent insulation layer and including a second via hole through one patterning process, wherein the centers of the first via hole and the second via hole coincide with each other in a thickness direction of the substrate, and a projection of the first via hole on the substrate is within a projection of the second via hole on the substrate.

6 Claims, 9 Drawing Sheets

(51) Int. Cl.
*G02F 1/1343* (2006.01)
*G02F 1/1362* (2006.01)

(52) U.S. Cl.
CPC .......... *H01L 27/124* (2013.01); *H01L 27/127* (2013.01); *H01L 27/1288* (2013.01); *G02F 2001/134372* (2013.01)

(56) References Cited

OTHER PUBLICATIONS

Prosecution history from U.S. Appl. No. 14/447,961, filed Jul. 31, 2014, including: Requirement for Restriction/Election dated Nov. 6, 2015, 6 pages; Non-Final Rejection dated Jan. 19, 2016, 7 pages; and Notice of Allowance dated Apr. 7, 2016, 7 pages; 20 pages total.

\* cited by examiner

ARRAY SUBSTRATE AND METHOD OF MANUFACTURING THE SAME, AND DISPLAY DEVICE

CROSS-REFERENCE TO RELATED APPLICATION

This application claims the benefit of Chinese Patent Application No. 201410062127.6 filed on Feb. 24, 2014 in the State Intellectual Property Office of China, the whole disclosure of which is incorporated herein by reference.

BACKGROUND OF THE INVENTION

Technical Field

The an embodiment of the present invention relate to the field of display technology, and in particular, to an array substrate, a method of manufacturing the same and a display device.

Description of the Related Art

With a continuous development of TFT-LCD (Thin Film Transistor-Liquid Crystal Display) display technique, there have been proposed and applied more and more new techniques, such as high resolution, high aperture rate, GOA (Gate on Array, array substrate row drive) technique and the like. Conventionally, for TFT-LCD, a mask for a gate metal layer, a mask for an active layer, a mask for a source/drain metal layer, a mask for a first transparent electrode layer, a mask for a passivation layer and a mask for a second transparent electrode layer are usually necessary in the patterning processes for manufacturing a multi-dimension field type array substrate. In addition, a mask for an organic transparent insulation layer is usually required to reduce parasitic capacitances among electrodes; each patterning process includes processes such as film-forming, exposing, developing, etching, stripping and so on.

However, a large number of patterning processes will directly result in an increase in product cost and a reduction in productivity of mass production. Thus, there is an increasing concern on further reduction of number of patterning processes.

SUMMARY OF THE INVENTION

According to an embodiment of one aspect of the present invention, there is provided a method of manufacturing an array substrate, including steps of: forming a thin film transistor on a substrate through a patterning process; and on the substrate on which the thin film transistor has been formed, forming an organic transparent insulation layer including a first via hole and a first transparent electrode layer disposed above the organic transparent insulation layer and including a second via hole through another one patterning process, wherein the centers of the first via hole and the second via hole coincide with each other in a thickness direction of the substrate, and a projection of the first via hole on the substrate is within a projection of the second via hole on the substrate.

According to an embodiment of another aspect of the present invention, there is provided an array substrate, including: a substrate; a thin film transistor provided on the substrate; an organic transparent insulation layer provided above the thin film transistor and including a first via hole; and a first transparent electrode layer disposed above the organic transparent insulation layer and including a second via hole, wherein the centers of the first via hole and the second via hole coincide with each other in a thickness direction of the substrate, and a projection of the first via hole on the substrate is within a projection of the second via hole on the substrate.

According to an embodiment of yet another aspect of the present invention, there is provided a display device including the array substrate as described above.

BRIEF DESCRIPTION OF THE DRAWINGS

The above and other features of the invention will become more apparent by describing in detail exemplary an embodiment thereof with reference to the accompanying drawings, in which.

REFERENCE NUMERALS

Figure 1:
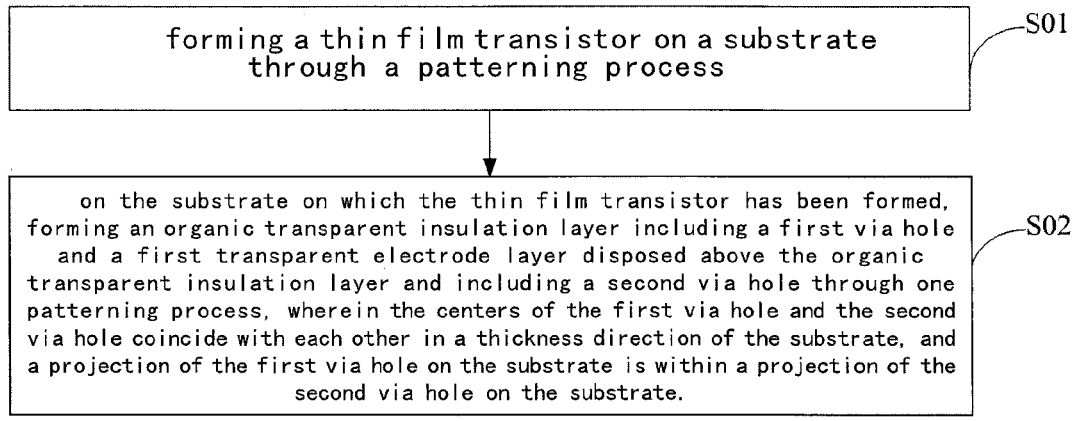
FIG. 1 is a flow chart of a method of manufacturing an array substrate according to an exemplary embodiment of the present invention.

10—substrate; 20—thin film transistor; 201—gate; 202—gate insulation layer; 203—semiconductor active layer; 203a—film of semiconductor active layer; 204—source; 204a—film of metal layer; 205—drain; 206—lead wire for a data line; 30—organic transparent insulation layer (resin layer); 30a—film of resin layer; 301—first via hole; 302—fifth via hole; 40—first transparent electrode layer; 40a—transparent conductive film; 401—second via hole; 402—sixth via hole; 50—passivation layer; 501—third via hole; 502—seventh via hole; 601—pixel electrode; 602—transparent electrode-remained pattern; 70—protective layer; 70a—film of protective layer; 701—fourth via hole; 702—eighth via hole; 80—photoresist; 801—photoresist-fully-remained portion; 802—photoresist-fully-removed portion; 803—photoresist-half-remained portion; 90—half tone mask; 901—fully opaque portion; 902—fully transparent portion; 903—translucent portion.

DETAILED DESCRIPTION OF PREFERRED AN EMBODIMENT OF THE INVENTION

Exemplary an embodiment of the present invention will be described hereinafter in detail with reference to the attached drawings, wherein the like reference numerals refer to the like elements. The present invention may, however, be embodied in many different forms and should not be construed as being limited to the embodiment set forth herein; rather, these an embodiment are provided so that the present invention will be thorough and complete, and will fully convey the concept of the disclosure to those skilled in the art.

According to a general inventive concept of the present invention, there is provided a method of manufacturing an array substrate, including steps of: forming a thin film transistor on a substrate through a patterning process; and on the substrate on which the thin film transistor has been formed, forming an organic transparent insulation layer including a first via hole and a first transparent electrode layer disposed above the organic transparent insulation layer and including a second via hole through one patterning process, wherein the centers of the first via hole and the second via hole coincide with each other in a thickness direction of the substrate, and a projection of the first via hole on the substrate is within a projection of the second via hole on the substrate.

According to a general inventive concept of the present invention, there is also provided an array substrate, including: a substrate; a thin film transistor, provided on the substrate; an organic transparent insulation layer provided above the thin film transistor and including a first via hole; and a first transparent electrode layer disposed above the organic transparent insulation layer and including a second via hole, wherein the centers of the first via hole and the second via hole coincide with each other in a thickness direction of the substrate, and a projection of the first via hole on the substrate is within a projection of the second via hole on the substrate.

In the following detailed description, for purposes of explanation, numerous specific details are set forth in order to provide a thorough understanding of the disclosed an embodiment. It will be apparent, however, that one or more an embodiment may be practiced without these specific details. In other instances, well-known structures and devices are schematically shown in order to simplify the drawing.

Figure 2:
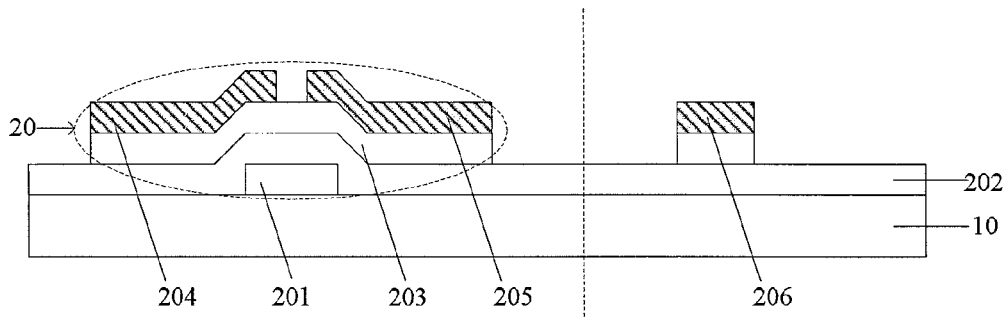
FIGS. 2-4 are schematic views showing the respective processes of manufacturing an array substrate according to an exemplary embodiment of the present invention.
Figure 3:
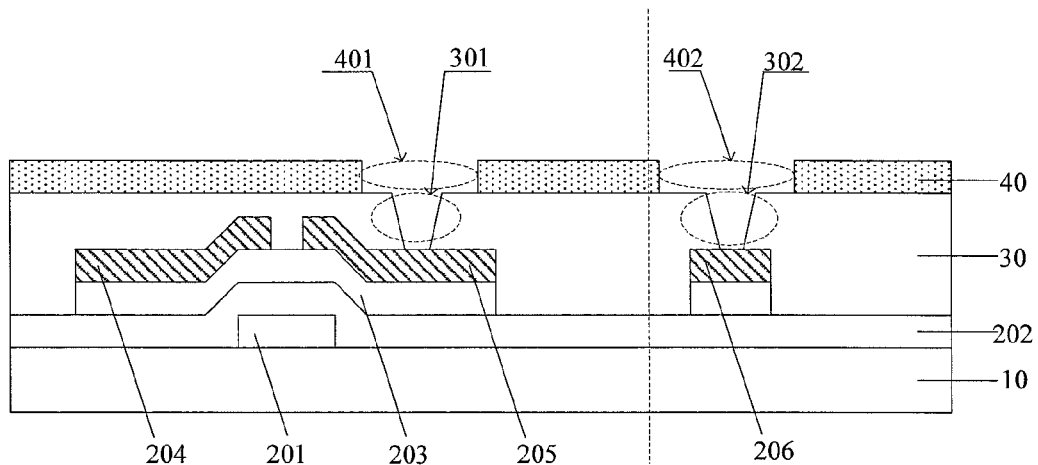

FIG. 1 is a flow chart of a method of manufacturing an array substrate according to an exemplary embodiment of the present invention. As shown in FIG. 1, the method includes following steps:

S01: as shown in FIG. 2, a thin film transistor 20 is formed on a substrate 10 through a patterning process; and S02: as shown in FIG. 3, on the substrate 10 on which the thin film transistor 20 has been formed, an organic transparent insulation layer 30 including a first via hole 301 and a first transparent electrode layer 40 disposed above the organic transparent insulation layer 30 and including a second via hole 40 are formed through one patterning process, wherein, the centers of the first via hole 301 and the second via hole 401 are overlapped with each other, and a size of the first via hole 301 is smaller than that of the second via hole 401; in other words, the centers of the first via hole 301 and the second via hole 401 coincide with each other in a thickness direction of the substrate 10, and a projection of the first via hole 301 on the substrate 10 is within a projection of the second via hole 401 on the substrate 10.

In step S01, the thin film transistor 20 includes a gate 201, a gate insulation layer 202, a semiconductor active layer 203, a source 204 and a drain 205. Of course, a gate line (not indicated in figures) electrically connected with the gate 201, a lead wire for the gate line (not indicated in figures) in a peripheral region of the array substrate, or the like may be formed while forming the gate 201; a data line (not indicated in figures) electrically connected with the source 204, a lead wire 206 for the data line in a peripheral region of the array substrate, or the like may be formed while forming the source 204 and the drain 205.

Here, the processes of manufacturing the thin film transistor 20 are not restrictive. For example, the semiconductor active layer 203, and the source/drain metal layer including the source 204, the drain 205 may be formed through two patterning processes. Specifically, the semiconductor active layer 203 is first formed through one patterning process, and then the source/drain metal layer including the source 204, the drain 205, the data line, and the lead wire 206 for the data line is formed on the substrate on which the semiconductor active layer 203 has been formed through another one patterning process. In the two patterning processes, common masks are used for exposure. In such a case, with reference to FIG. 2, a pattern, which is disposed below the lead wire 206 for the data line and in the same layer as the semiconductor active layer 20 may not be formed as actually required.

Based on the structure of the thin film transistor 20, the semiconductor active layer 203 and the source/drain metal layer including the source 204 and the drain 205 may be formed through one patterning process. Specifically, in one patterning process, a half scale or gray tone mask is used for exposure, thereby forming the semiconductor active layer 203 and the source/drain metal layer including the source 204, the drain 205, the data line, and the lead wire 206 for the data line.

in step S02, for example, the first via hole 301 and the second via hole 401 are formed to correspond to the drain 205, and the first transparent electrode layer 40 is used as common electrode, thereby a pixel electrode which will be formed subsequently can be electrically connected with the drain 205 through the first via hole 301 and second via hole 401, and is prevented from being shorted with the first transparent electrode layer 40.

Further, the organic transparent insulation layer 30 may further include a fifth via hole 302 disposed in the peripheral region of the array substrate, the first transparent electrode layer 40 may further include a sixth via hole 402 disposed in the peripheral region of the array substrate, wherein the fifth via hole 302 and the sixth via hole 402 are overlapped with each other, and a size of the fifth via hole 302 is smaller than that of the sixth via hole. In other words, the centers of the fifth via hole 302 and the sixth via hole 402 substantially coincide with each other in the thickness direction of the substrate 10, and a projection of the fifth via hole 302 on the substrate 10 is within a projection of the sixth via hole 402 on the substrate 10.

Here, for example, the fifth via hole 302 and the sixth via hole 402 may correspond to the lead wire 206 for the data line, so that the lead wire 206 for the data line may be connected to an upper layer of array substrate through the fifth via hole 302 and the sixth via hole 402 so as to be connected with a drive IC.

It should be noted that in an embodiment of the present invention, the positions of the first via hole 301 and the second via hole 401 may be set according to a function of a subsequently formed electrically conductive pattern and a function of an electrically conductive pattern below the first via hole 301 and second via hole 40, which is not limited herein.

Further, the function of the first transparent electrode layer 40 may be defined according to the type of the array substrate, which is not limited herein.

In the array substrate of the present invention formed by the above method and mentioned subsequently, on one hand, the flatness of a surface of the array substrate can be improved by forming the organic transparent insulation layer 30 above the thin film transistor 20; on the other hand, the organic transparent insulation layer 30 including the first via hole 301 and the first transparent electrode layer 40 disposed above the organic transparent insulation layer 30 and including the second via hole 40 may be formed through one patterning process, and a size of the first via hole 301 is smaller than that of the second via hole 401, thereby the electrically conductive pattern to be manufacturing subsequently can be avoided from being shorted with the first transparent electrode layer 40 when passing through the first via hole 301 and the second via hole 401, and the number of patterning processes can be reduced, resulting in an increase in productivity of mass production and a reduction in cost.

Figure 4:
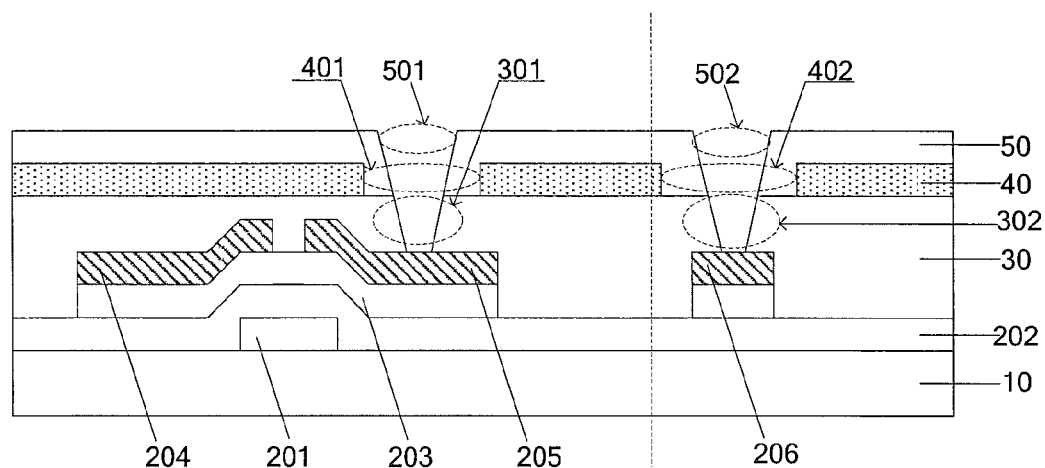

In a case that the first via hole 301 and the second via hole 401 correspond to the drain 205, the method further includes following steps:

S03: as shown in FIG. 4, a film of passivation layer is formed on the substrate on which the first transparent electrode layer 40 has been formed, and a passivation layer 50 including a third via hole 501 is formed through one patterning process, wherein, the third via hole 501 and the second via hole 401 are overlapped with each other, and a size of the third via hole 501 is smaller than that of the second via hole 401; in other words, the centers of the third via hole 501 and the second via hole 401 substantially coincide with each other in the thickness direction of the substrate 10, and a projection of the third via hole 501 on the substrate 10 is within a projection of the second via hole 401 on the substrate 10.

In an exemplary embodiment, in a case that the fifth via hole 302 and the sixth via hole 402 correspond to the lead wire 206 for the data line, the passivation layer 50 may further include a seventh via hole 502 disposed in the peripheral region of the array substrate, and the seventh via hole 502 and the sixth via hole 402 are overlapped with each other, but a size of the seventh via hole 502 is smaller than that of the sixth via hole 402; in other words, the centers of the seventh via hole 502 and the sixth via hole 402 substantially coincide with each other in the thickness direction of the substrate 10, and a projection of the seventh via hole 502 on the substrate 10 is within a projection of the sixth via hole 402 on the substrate 10.

Figure 5:
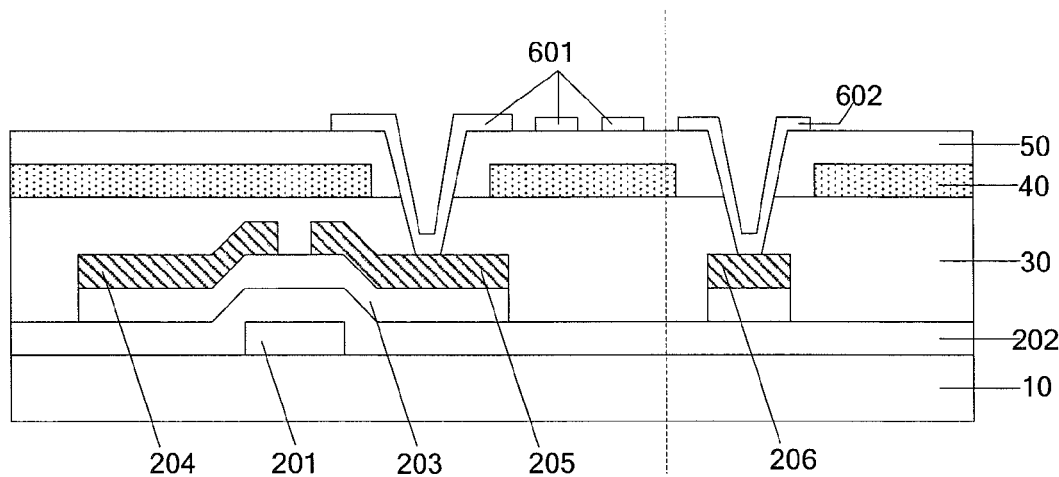
FIG. 5 is a structural schematic view of an array substrate according to a first exemplary embodiment of the present invention.

S04: as shown in FIG. 5, a second transparent electrode layer including a pixel electrode 601 is formed through one patterning process on the substrate on which the passivation layer 50 has been formed, wherein, the pixel electrode 601 is electrically connected with the drain 205 at least through the third via hole 501, the second via hole 401 and the first via hole 301.

Since the size of second via hole 401 in the first transparent electrode layer 40 is larger than those of the first via hole 301 in the organic transparent insulation layer 30 and the third via hole 501 in the passivation layer 50, the first transparent electrode layer 40 can be prevented from being shorted with the pixel electrode 601 when the pixel electrode 601 is electrically connected with the drain 205.

In an exemplary embodiment, the second transparent electrode layer may further include a transparent electrode-remained pattern 602 disposed in the peripheral region of the array substrate, and the transparent electrode-remained pattern 602 is electrically connected with the lead wire 206 for the data line at least through the seventh via hole 502, the sixth via hole 402 and the fifth via hole 302.

Since the size of the sixth via hole 402 in the first transparent electrode layer 40 is larger than those of the fifth via hole 302 in the organic transparent insulation layer 30 and the seventh via hole 502 in the passivation layer 50, the first transparent electrode layer 40 can be prevented from being shorted with the transparent electrode-remained pattern 602 when the transparent electrode-remained pattern 602 is electrically connected with the lead wire 206 for the data line.

It should be noted that according to a principle of an Advanced-Super Dimensional Switching (referred to as ADS) array substrate, in a case that the pixel electrode and a common electrode are disposed in different layers, the upper electrode should be a strip electrode, the lower electrode should be a plate electrode. Since the first transparent electrode layer 40 is used the common electrode and is a plate electrode, the pixel electrode 601 should be made into a strip electrode.

Here, since the organic transparent insulation layer 30 is formed below the second transparent electrode layer including the pixel electrode 601 and above the thin film transistor 20, a parasitic capacitance between the gate 201 and the drain 205 may be reduced.

For the above step S01, in order to further reduce the number of patterning processes, in an alternative embodiment of the present invention, with reference to FIG. 2, a gate metal layer including the gate 201 is formed on the substrate 10 through one patterning process, and forming a gate insulation layer 202; and on the substrate on which the gate insulation layer 202 has been formed, a semiconductor active layer 203 and a source/drain metal layer including the source 204, the drain 205, the data line (not indicated in figures) and the lead wire 206 for the data line are formed through one patterning process.

Figure 6A:
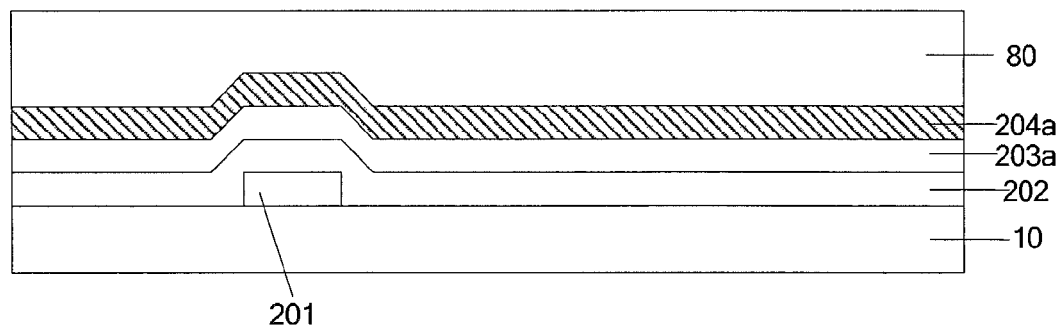
FIGS. 6a-6e are schematic views showing processes of manufacturing a semiconductor active layer and source/drain metal layer including a source and a drain through one patterning process according to an exemplary embodiment of the present invention.

Specifically, the step of forming the semiconductor active layer 203 and a source/drain metal layer including the source 204, the drain 205, the data line (not indicated in figures) and the lead wire 206 for the data line through one patterning process may include the following steps:

S101: as shown in FIG. 6a, a film of semiconductor active layer 203a and a metal film 204a are formed in this order on the gate insulation layer 202, and photoresist 80 is formed on the metal film.

The film of semiconductor active layer 203a may be a film of metal oxide semiconductor active layer, or may be composed of a layer of amorphous silicon film and a layer of n+ amorphous silicon film.

Figure 6B:
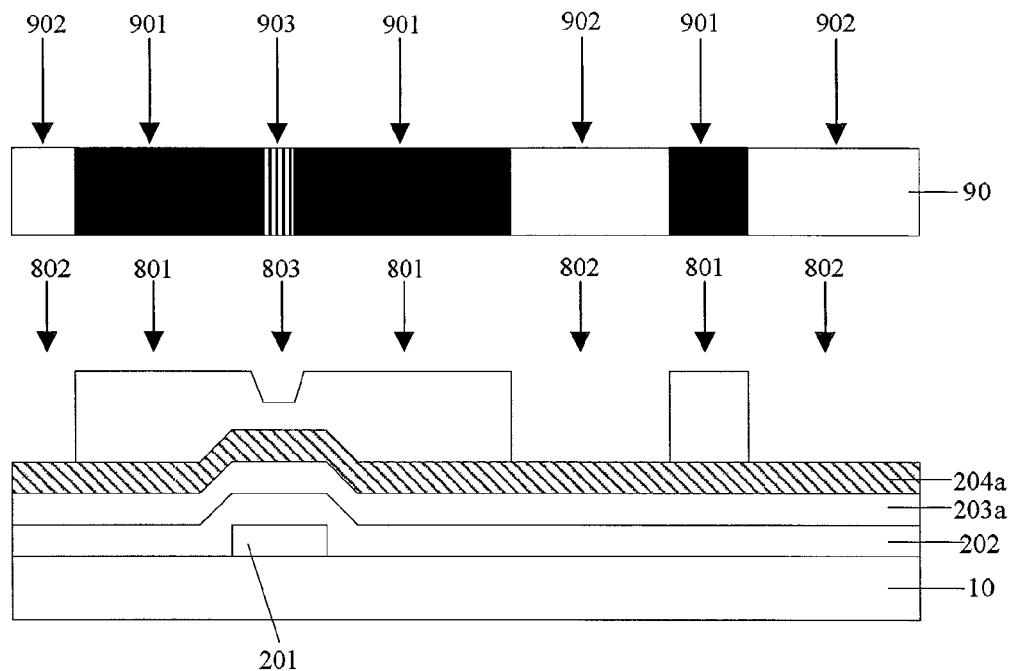

S102: as shown in FIG. 6b, a photoresist-fully-remained portion 80, a photoresist-half-remained portion 803 and a photoresist-fully-removed portion 802 are formed after exposing and developing the substrate on which the photoresist has been formed by using a half tone mask 90, wherein, the photoresist-fully-remained portion 801 corresponds regions in which the source 204, the drain 205, the data line (not indicated in figures) and the lead wire 206 for the data line 206 are to be formed, the photoresist-half-remained portion 803 corresponds to a region formed between the source 204 and the drain 205, and the photoresist-fully-removed portion 802 corresponds to other regions.

Here, an operating principle of a common mask is firstly described so as to provide a better understanding of an operating principle of the half tone mask 90.

A common mask is a means which has a light shielding metal layer having a particular pattern and formed on a transparent substrate material so as to achieve a selective exposure of the photoresist 80. A region covered by the light shielding metal layer is fully opaque, while a region which is not covered by the light shielding metal layer is fully transparent. When the photoresist 80 is exposed by using the common mask, a portion of photoresist 80 corresponding to the fully opaque portion of the common mask can not be irradiated by ultraviolet light, and thus forms the photoresist-fully-remained portion 801 after developed, while a portion of the photoresist 80 corresponding to the fully transparent portion of the common mask forms the photoresist-fully-removed portion 802 after developed. As such, when etching at least one layer of film covered by the photoresist, the film covered by the photoresist-fully-remained portion 801 will be remained, while the film covered by the photoresist-fully-removed portion 802 will be fully etched and removed, thereby forming at least one pattern layer having a characterized pattern.

By using the common mask, the at least one pattern layer has the same pattern. When it is desired to form at least two pattern layers having different patterns through one patterning process, the half tone mask 90 is needed.

With reference to FIG. 6b, in comparison with the common mask, the half tone mask 90 further includes a translucent portion 903 in addition to a fully opaque portion 901 and a fully transparent portion 902. That is, the half tone mask 90 means that an opaque light shielding metal layer is formed in some regions on a transparent substrate material, a translucent light shielding metal layer is formed in some other regions on the transparent substrate material, and no light shielding metal layer is formed in the remaining regions on the transparent substrate material, wherein, a thickness of the translucent light shielding metal layer is less than that of the fully opaque light shielding metal layer. The transmittance of the translucent light shielding metal layer for ultraviolet light may be changed by adjusting the thickness of the translucent light shielding metal layer.

Based on the above description, the operating principle of the half tone mask 90 is described as follows: thicknesses of the light shielding metal layer at different regions on the half tone mask 90 are controlled so that intensities of light transmitting through the different regions during exposure are different, thereby the photoresist 80 is selectively exposed and developed to form the photoresist-fully-remained portion 801, the photoresist-half-remained portion 803 and the photoresist-fully-removed portion 802, which correspond to the fully opaque portion 901, the translucent portion 903 and the fully transparent portion 90 of the half tone mask 90 respectively. As such, when performing a first etching, films covered by the photoresist-fully-remained portion 801 and the photoresist-half-remained portion 803 will be remained, and thereafter, since a thickness of the photoresist-fully-remained portion 80 is larger than that of the photoresist-half-remained portion 80, the photoresist of the photoresist-fully-remained portion 801 is still remained after the photoresist of the photoresist-half-remained portion 803 is ashed off, so that exposed film can be selectively etched to obtain at least two pattern layers having different patterns.

An operating principle of the gray tone mask is similar to the half tone mask 90 and will not be repeatedly described herein, and the difference between the gray tone mask and the half tone mask 90 lies in that: the translucent portion 903 of the half tone mask is formed by a translucent light shielding metal layer which is formed on the transparent substrate material and has a relatively thinner thickness, that is, the transmittance for ultraviolet light is adjusted by controlling the thickness of the metal layer so that the photoresist corresponding to the translucent portion has a different amount of exposure from other regions; while the translucent portion of the gray tone mask is formed by forming some slits of narrow stripe shape therein, thus optical phenomena such as scattering, diffraction or the like will occur when ultraviolet light passes the slit structures so that the photoresist corresponding to the translucent portion has a different amount of exposure from other regions.

The photoresist 80 mentioned in all the embodiments of the present invention may be positive photoresist, that is, in the half tone mask 90, a region corresponding to the photoresist-fully-removed portion 802 is full exposure region, which corresponds to the fully transparent portion 902 of the half tone mask 90; a region corresponding to the photoresist-half-remained portion 803 is a half-exposure region, which corresponds to the translucent portion 903 of the half tone mask 90, and a region corresponding to the photoresist-fully-remained portion 801 is a non-exposure region, which corresponds to the fully opaque portion 901 of the half tone mask 90.

Figure 6C:
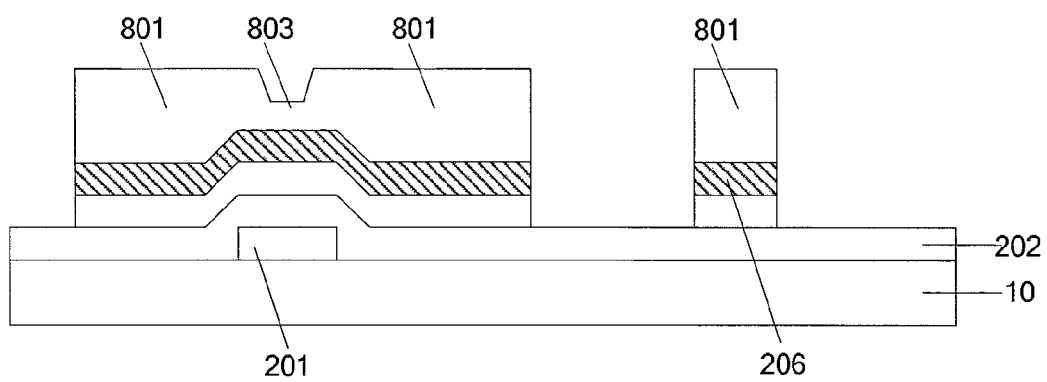

S103: as shown in FIG. 6c, the metal film 204a and the film of semiconductor active layer 203a corresponding to the photoresist-fully-removed portion 802 are removed by using an etching process, so that at least the lead wire 206 for the data line and a remained pattern (not indicated in figures) disposed below the lead wire 206 for the data line are formed.

Figure 6D:
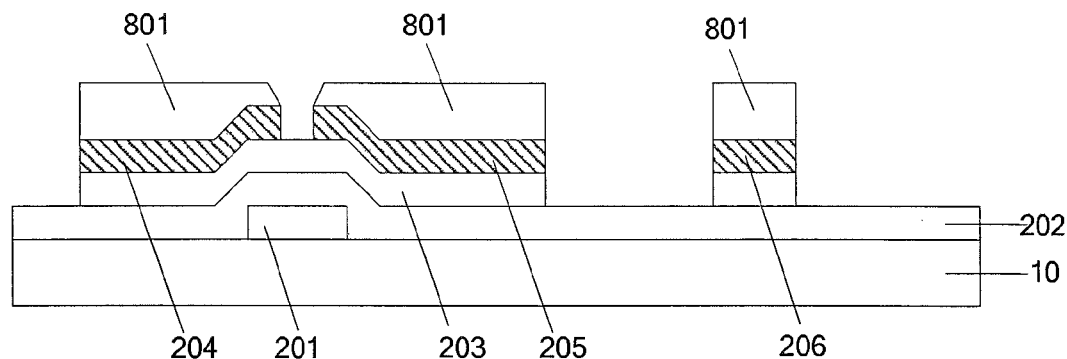

S104: as shown in FIG. 6d, the photoresist of the photoresist-half-remained portion 803 is removed by using an ashing process, and the source 204, the drain 205 and the semiconductor active layer 203 are formed by etching.

Here, when material of the film of semiconductor active layer is metal oxide semiconductor, it is only needed to remove naked metal film by using an etching process after removing the photoresis of the photoresist-half-remained portion 803 so as to form the source 204 and the drain 205, and the semiconductor active layer 203 can be formed in step S103.

When the film of semiconductor active layer is consisted of a layer of amorphous silicon film and a layer of n+ amorphous silicon film, after removing the photoresist of the photoresist-half-remained portion 803, not only the naked metal film needs to be etched and removed, but also the n+ amorphous silicon film needs to be etched and removed. In such a case, the semiconductor active layer 203 is formed in the present step S104.

Figure 6E:
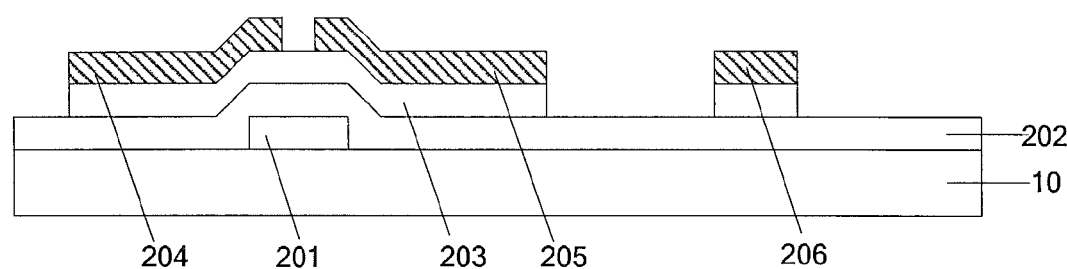

S105: as shown in FIG. 6e, the photoresist of the photoresist-fully-remained portion is removed by using a stripping process.

Figure 7A:
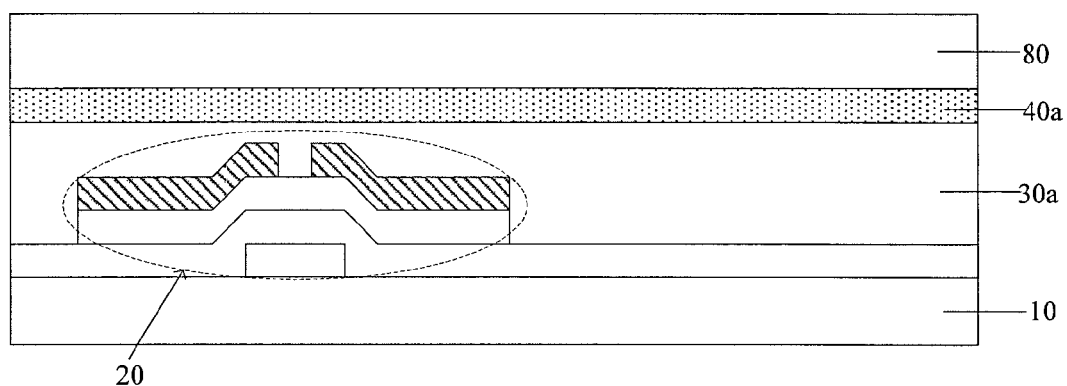
FIGS. 7a-7e are schematic views showing the processes of manufacturing an organic transparent insulation layer including a first via hole and a first transparent electrode layer including a second via hole through one patterning process according to an exemplary embodiment of the present invention.

For the above step S02, the material of the organic transparent insulation layer 30 may be an organic transparent insulation material having a high transmittance. A resin material, such as photoresist, can be taken as an example. The step S02 may include the following steps:

S201: as shown in FIG. 7a, a film of resin layer 30a and a transparent conductive film 40a are formed in this order on the substrate on which the thin film transistor 20 has been formed, and photoresist 80 is formed on the transparent conductive film.

A thickness of the film of resin layer 30a may be 1.0~2.5 μm. Here, the thickness of the film of resin layer 30a may be controlled to be 1.5 μm, for example.

Figure 7B:
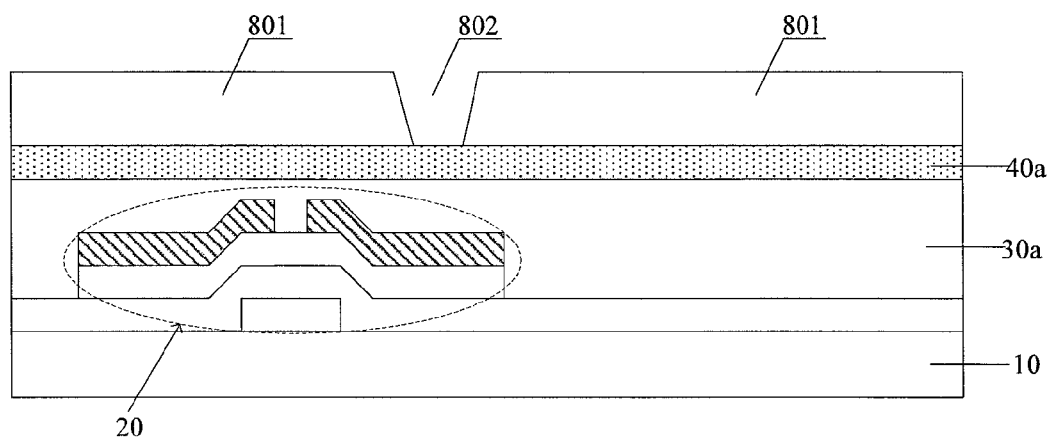

S202: as shown in FIG. 7b, the photoresist-fully-remained portion 801 and the photoresist-fully-removed portion 802 are formed after exposing and developing the substrate on which the photoresist has been formed by using a common mask, wherein, the photoresist-fully-removed portion 802 at least corresponds to the second via hole 401 to be formed, and a width of the photoresist-fully-removed portion 802 is smaller than that of the second via hole 401 to be formed.

In the above step, the reason that the width of the photoresist-fully-removed portion 802 corresponding to the second via hole 401 to be formed is set to be smaller than that of the second via hole 401 to be formed is that, in the following step S203, the transparent conductive film 40a is etched not only in a longitudinal direction but also in a transversal direction when being wet etched, the width of the subsequently formed second via hole 401 will be larger if the photoresist-fully-removed portion 802 corresponding to the second via hole 401 to be formed is set to be wider, which will result in that the first transparent electrode layer 40 used as the common electrode will be over etched.

Further, the width of the second via hole 401 may be adjusted by controlling etching time, which can be set according to actual requirements, and is not limited herein.

Here, a thickness of the photoresist may be, for example, 2.0~2.5 μm.

Figure 7C:
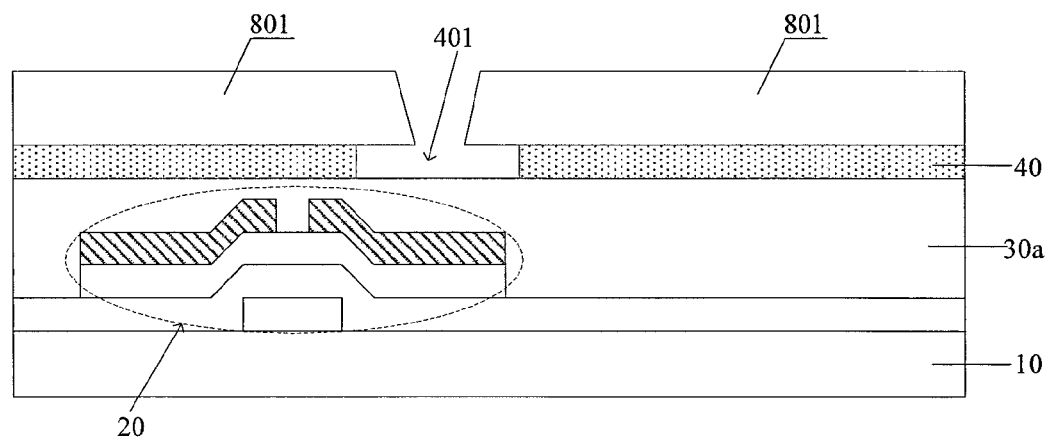

S203: as shown in FIG. 7c, the transparent conductive film 40a below the photoresist-fully-removed portion 802 is over etched by using a wet etching process so as to form the first transparent electrode layer 40 including the second via hole 401.

Here, when performing wet etching, an etched portion of the transparent conductive film 40a in a horizontal direction may be relatively larger by suitably controlling a transversal etching rate. For example, with respect to an interface between the photoresist-fully-removed portion 802 and the photoresist-fully-remained portion 801, a distance from an edge of the second via hole 401 formed after etching to the interface may be about 2 μm. The purpose to do so is to avoid the size of the second via hole 401 from being the same as that of the first via hole 301, thereby the pixel electrode 601 can be prevented from being shorted with the first transparent electrode layer 40 when the pixel electrode 601 is subsequently electrically connected with the drain 205.

Figure 7D:
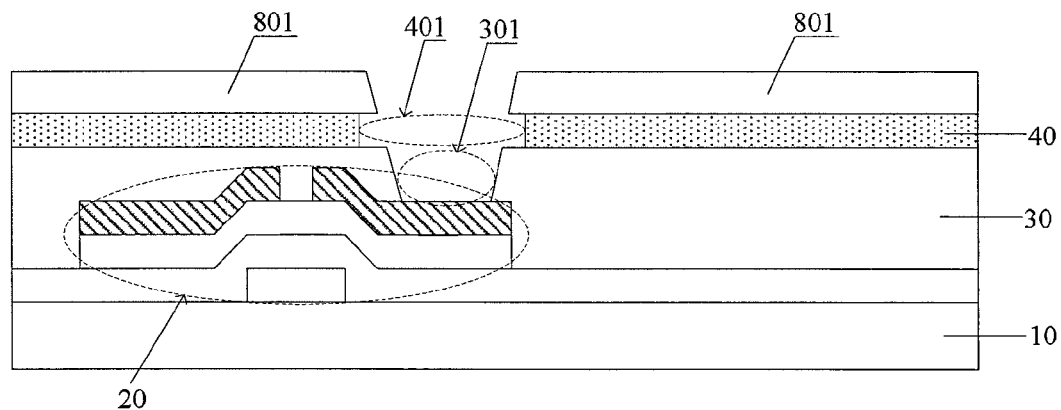

S204: as shown in FIG. 7d, the film of resin layer 30a below the second via hole 401 is removed by using an ashing process so that the size of the first via hole 301 formed in the resin layer 30 is smaller than that of the second via hole 401.

Since the photoresist and the film of resin layer are similar in material, the photoresist of the photoresist-fully-remained portion 801 above the film of resin layer 30a will also be etched while etching the film of resin layer 30a below the second via hole 401. Further, considering that the size of the formed first via hole 301 should to be smaller than that the second via hole 401 when etching the film of resin layer 30a and the etching in the transversal direction should be avoided as much as possible when etching the first via hole 301, the etching is performed hereby through an ashing process using a dry etching, during which relevant processes are controlled so that the size of the formed first via hole 301 is smaller than that of the second via hole 401.

Figure 7E:
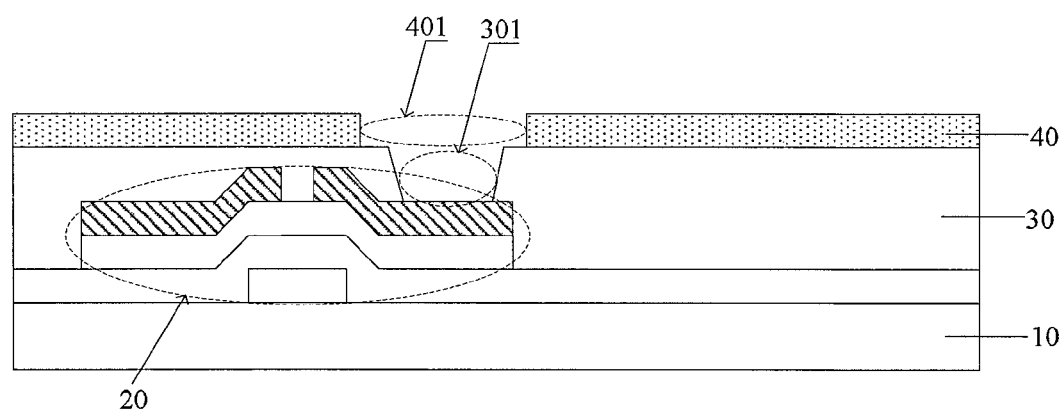

S205: as shown in FIG. 7e, residual photoresist is removed by using a stripping process.

In an exemplary embodiment, during the above steps S201-S205, the fifth via hole 302 and the sixth via hole 402 may be manufactured synchronously in the peripheral region in the similar ways as described above, which will not be repeatedly described. The centers of the fifth via hole 302 and the sixth via hole 402 substantially coincide with each other in the thickness direction of the substrate, and a projection of the fifth via hole 302 on the substrate is within a projection of the sixth via hole 402 on the substrate.

Further, considering the bonding strength between the organic transparent insulation layer 30 and the thin film transistor 20, in an embodiment of the present invention, it is preferable that a protective layer 70 is further formed between the thin film transistor 20 and the organic transparent insulation layer 30, wherein, the protective layer 70 includes a fourth via hole 701, which is overlapped with the second via hole 401, and has a size smaller than that of the second via hole 401; in other words, the centers of the fourth via hole 701 and the second via hole 401 substantially coincide with each other in the thickness direction of the substrate, and a projection of the fourth via hole 701 on the substrate is within a projection of the second via hole 401 on the substrate.

In an exemplary embodiment, the protective layer may further include an eighth via hole 702, which is overlapped with the sixth via hole 402 and has a size smaller than that of the sixth via hole 402. The centers of the eighth via hole 702 and the sixth via hole 402 substantially coincide with each other in the thickness direction of the substrate, and a projection of the eighth via hole 702 on the substrate is within a projection of the sixth via hole 402 on the substrate.

Here, the protective layer 70 may be a silicon nitride layer, a silicon oxide layer or a silicon oxynitride layer.

Figure 8A:
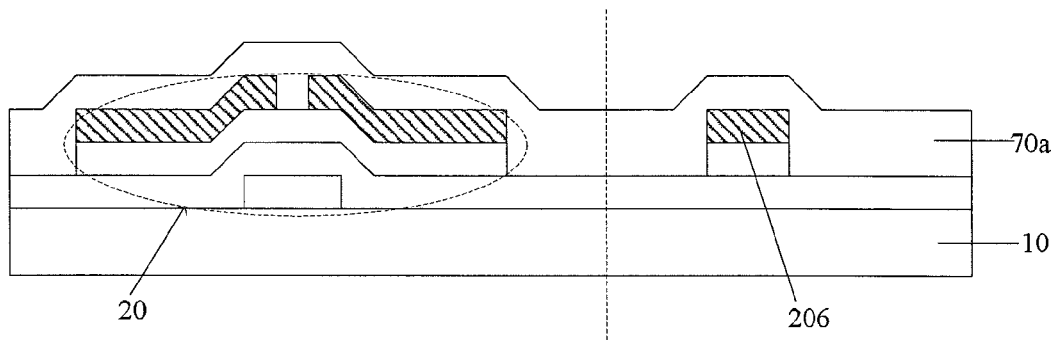
FIGS. 8a-8c are schematic views showing the processes of manufacturing a protective layer including a fourth via hole and a passivation layer including a third via hole through one patterning process according to an exemplary embodiment of the present invention.

Therefore, on the substrate on which the thin film transistor 20 has been formed, the protective layer 70 including the fourth via hole 701, the organic transparent insulation layer 30 including the first via hole 301, the first transparent electrode layer 40 including the second via hole 401, and the passivation layer 50 including the third via hole 501 are formed in this order as follows:

S301: as shown in FIG. 8a, a film of protective layer 70a is formed on the substrate on which the thin film transistor 20 has been formed.

Figure 8B:
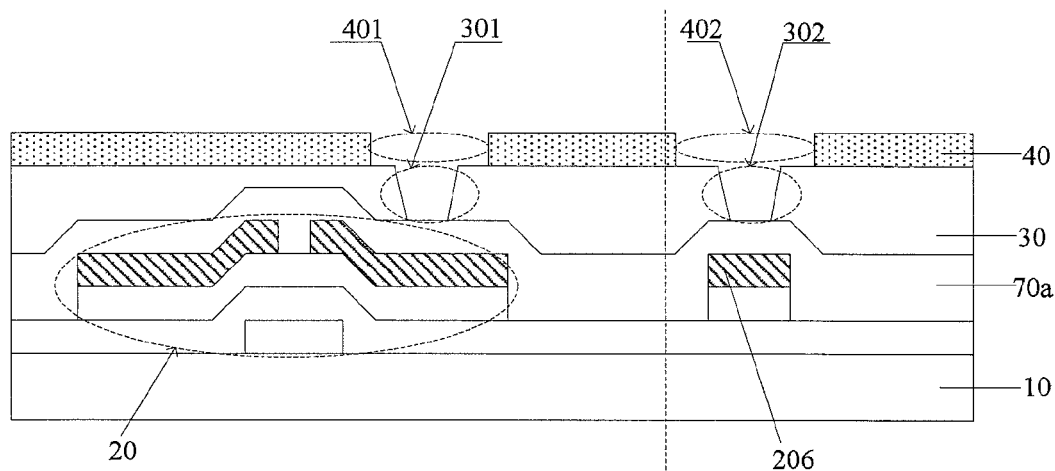

S302, as shown in FIG. 8b, the organic transparent insulation layer 30 including the first via hole 301 and the first transparent electrode layer 40 including the second via hole 401 are formed above the film of protective layer 70a through one patterning process.

In an exemplary embodiment, the organic transparent insulation layer 30 may further include a fifth via hole 302 disposed in the peripheral region of the array substrate, and the first transparent electrode layer 40 may further include a sixth via hole 402 disposed in the peripheral region of the array substrate.

Figure 8C:
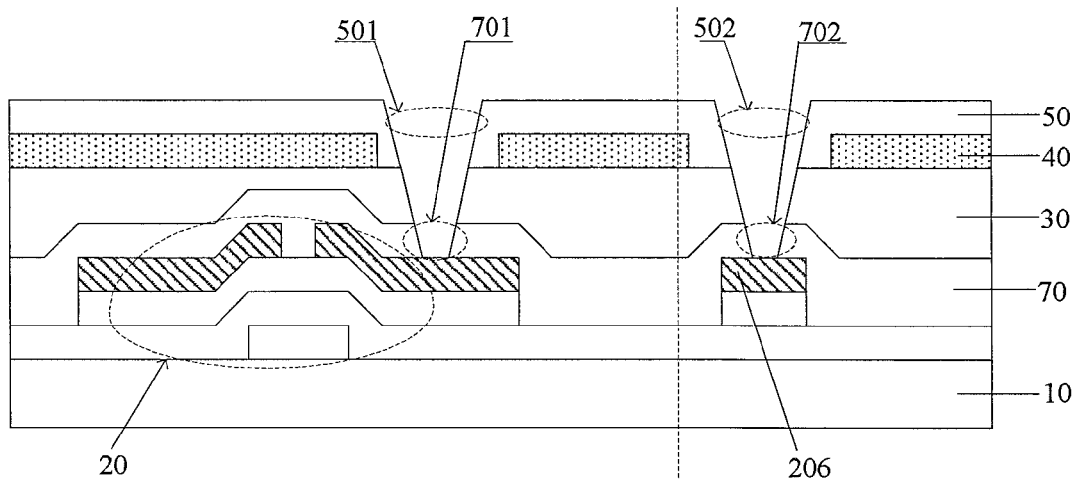

S303: as shown in FIG. 8c, a film of passivation layer is formed on the substrate on which the first transparent electrode layer 40 has been formed, and the passivation layer 50 including the third via hole 501 and the protective layer 70 including the fourth via hole 701 are formed through one patterning process.

The third via hole 501 and the fourth via hole 701 are overlapped with the second via hole 401, and the sizes of the third via hole 501 and the fourth via hole 701 are smaller than that of the second via hole 401; in other words, the centers of the third via hole 501, the fourth via hole 701 and the second via hole 401 substantially coincide with each other in the thickness direction of the substrate, and projections of the third via hole 501 and the fourth via hole 701 on the substrate are within that of the second via hole 401 on the substrate.

In an exemplary embodiment, the passivation layer 50 may further include a seventh via hole 502 disposed in the peripheral region of the array substrate, the protective layer 70 may further include an eighth via hole 702 disposed in the peripheral region of the array substrate, and the seventh via hole 502 and the eighth via hole 702 are overlapped with the sixth via hole 402, but sizes of the seventh via hole 502 and the eighth via hole 702 are smaller than that of the sixth via hole 402; in other words, the centers of the seventh via hole 502, the eighth via hole 702 and the sixth via hole 402 substantially coincide with each other in the thickness direction of the substrate, and projections of the seventh via hole 502 and the eighth via hole 702 on the substrate are within that of the sixth via hole 402 on the substrate.

Figure 9:
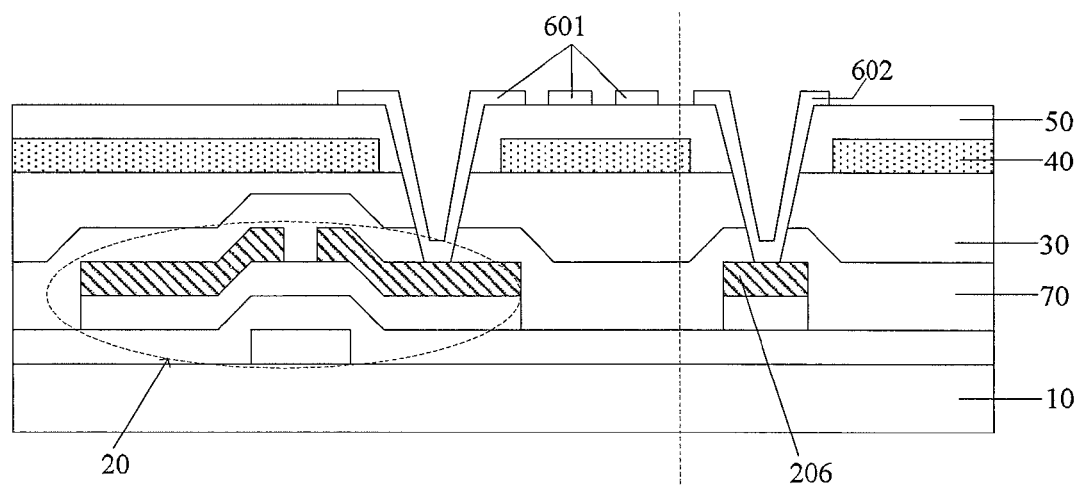
FIG. 9 is a structural schematic view of an array substrate according to a second exemplary embodiment of the present invention.

On basis of the above steps S301-S303, as shown in FIG. 9, a second transparent electrode layer including a pixel electrode 601 is formed, wherein, the pixel electrode 601 is electrically connected with the drain 205 through the third via hole 501, the second via hole 401, the first via hole 301 and the fourth via hole 701.

In an exemplary embodiment, the second transparent electrode layer may further include a transparent electrode-remained pattern 602, which is disposed in the peripheral region of the array substrate and is electrically connected with the lead wire 206 for the data line through the seventh via hole 502, the sixth via hole 402, the fifth via hole 302 and the eighth via hole 702.

An array substrate having corresponding structure can be manufactured through the above method. As such, an embodiment of the present invention further provides an array substrate which, with reference FIG. 5, includes: a substrate 10; a thin film transistor 20 provided on the substrate; an organic transparent insulation layer 30 provided above the thin film transistor 20 and including a first via hole 301; and a first transparent electrode layer 40 disposed above the organic transparent insulation layer 30 and including a second via hole 401, wherein, the first via hole 301 and the second via hole 401 are overlapped with each other (see FIG. 3 among process schematic views for manufacturing the array substrate), and a size of the first via hole 301 is smaller than that of the second via hole 401, wherein, the organic transparent insulation layer 30 including the first via hole 301 and the first transparent electrode layer 40 including the second via hole 401 are manufactured through one patterning process (see FIGS. 7a-7e).

Here, with reference to FIG. 5, for example, the first via hole 301 and the second via hole 401 are formed to correspond to the drain 205, and the first transparent electrode layer 40 is used as common electrode, thereby a pixel electrode which will be formed subsequently can be electrically connected with the drain 205 through the first via hole 301 and second via hole 401, and is prevented from being shorted with the first transparent electrode layer 40.

Continued with reference to FIG. 5, in the peripheral region of the array substrate, the first transparent electrode layer 40 further includes the sixth via hole 402 (see FIG. 3), and the organic transparent insulation layer 30 further includes the fifth via hole 302 (see FIG. 3), wherein, the fifth via hole 302 and the sixth via hole 402 correspond to the lead wire 206 for the data line of the source/drain metal layer, and the size of the sixth via hole 402 is larger than that of the fifth via hole 302.

As such, the lead wire 206 for the data line may be connected to an upper layer of array substrate through the fifth via hole 302 and the sixth via hole 402 so as to be connected with a drive IC.

With reference to FIG. 5, in a case that the first via hole 301 and the second via hole 401 correspond to the drain 205, the array substrate further includes a passivation layer 50, which is disposed above the first transparent electrode layer 40 and includes a third via hole 501 (see FIG. 4), and a second transparent electrode layer, which is disposed above the passivation layer 50 and includes a pixel electrode 601, wherein, the third via hole 501 and the second via hole 401 are overlapped with each other, and a size of the third via hole 501 is smaller than that of the second via hole 401; the pixel electrode 601 is electrically connected with the drain 205 of the thin film transistor at least through the third via hole 501, the second via hole 401 and the first via hole 301.

Furthermore, as shown in FIG. 9, the array substrate further includes a protective layer 70 which is provided between the thin film transistor 20 and the organic transparent insulation layer 30 and includes a fourth via hole 701; the fourth via hole 701 and the second via hole 401 are overlapped with each other, and a size of the fourth via hole 701 is smaller than that of the second via hole 401; the pixel electrode 601 is electrically connected with the drain 205 through the third via hole 501, the second via hole 401, the first via hole 301 and the fourth via hole 701. the protective layer 70 including the fourth via hole 701 and the passivation layer 50 including the third via hole 501 are manufactured through one patterning process (see FIGS. 8a-8c).

In an exemplary embodiment, in the peripheral region of the array substrate, the protective layer 70 further includes an eighth via hole 702, the eighth via hole 702 and the sixth via hole 402 are overlapped with each other, and a size of the eighth via hole 702 is smaller than that of the sixth via hole 402. In such a case, the transparent electrode-remained pattern 602 is electrically connected with the lead wire 206 for the data line through the seventh via hole 502, the sixth via hole 402, the fifth via hole 302 and the eighth via hole 702.

The material of the organic transparent insulation layer may be resin. A thickness of the organic transparent insulation layer may be 1.0~2.5 µm.

An embodiment of the present invention further provide a display device including the array substrate as described above.

The display device may be a liquid crystal display, a liquid crystal television, a digital photo frame, a mobile phone, a tablet computer, or any other products or components having a displaying function.

Although several exemplary an embodiment have been shown and described, it would be appreciated by those skilled in the art that various changes or modifications may be made in these an embodiment without departing from the principles and spirit of the disclosure, the scope of which is defined in the claims and their equivalents.

What is claimed is:

1. An array substrate, including:
   a substrate;
   a thin film transistor provided on the substrate;
   an organic transparent insulation layer provided above the thin film transistor and including a first via hole;
   a first transparent electrode layer disposed above the organic transparent insulation layer and including a second via hole,
   a passivation layer provided above the first transparent electrode layer and including a third via hole;
   a protective layer provided between the thin film transistor and the organic transparent insulation layer and including a fourth via hole; and
   a second transparent electrode layer disposed above the passivation layer and including a pixel electrode,
   wherein the centers of the first via hole and the second via hole substantially coincide with each other in a thickness direction of the substrate, and a projection of the first via hole on the substrate is within the projection of the second via hole on the substrate, and wherein the centers of the fourth via hole and the second via hole substantially coincide with each other in the thickness direction of the substrate, and a projection of the fourth via hole on the substrate is within the projection of the second via hole on the substrate, and wherein the centers of the third via hole and the second via hole substantially coincide with each other in the thickness direction of the substrate, and a projection of the third via hole on the substrate is within a projection of the second via hole on the substrate, and the pixel electrode is electrically connected with a drain of the thin film transistor through the third, second, and first and fourth via holes.

2. The array substrate according to claim 1, wherein: the material of the organic transparent insulation layer is resin.

3. The array substrate according to claim 2, wherein:

a thickness of the organic transparent insulation layer is within a range of 1.0~2.5 μm.

4. The array substrate according to claim 1, wherein:

the organic transparent insulation layer further includes a fifth via hole disposed in a peripheral region of the array substrate;

the first transparent electrode layer further includes a sixth via hole disposed in the peripheral region of the array substrate;

the passivation layer further includes a seventh via hole disposed in the peripheral region of the array substrate;

the protective layer further includes an eighth via hole disposed in the peripheral region of the array substrate;

wherein the centers of the fifth, sixth, seventh and eighth via holes substantially coincide with each other in the thickness direction of the substrate, projections of the fifth, seventh and eighth via holes on the substrate are within a projection of the sixth via hole on the substrate, and the eighth via hole is electrically connected with a lead wire for a data line of array substrate.

5. A display device, including the array substrate according to claim 1.

6. The display device according to claim 5, wherein the array substrate is the array substrate according to claim 4.

* * * * *